(12) United States Patent
Meir

(10) Patent No.: US 7,569,923 B2
(45) Date of Patent: Aug. 4, 2009

(54) RECYCLYING FAULTY MULTI-DIE PACKAGES

(75) Inventor: Avraham Meir, Rishon Lezion (IL)

(73) Assignee: Sandisk Il. Ltd., Kfar Saba (IL)

( * ) Notice: Subject to any disclaimer, the term of this patent is extended or adjusted under 35 U.S.C. 154(b) by 452 days.

(21) Appl. No.: 11/395,226

(22) Filed: Apr. 3, 2006

(65) Prior Publication Data
US 2007/0158825 A1 Jul. 12, 2007

Related U.S. Application Data

(60) Provisional application No. 60/757,602, filed on Jan. 11, 2006.

(51) Int. Cl.
*H01L 23/48* (2006.01)
(52) U.S. Cl. .................. 257/693; 257/690; 257/691; 365/185.11; 365/185.18

(58) Field of Classification Search ................. 257/690, 257/691, 693; 365/263, 185.11, 185.18
See application file for complete search history.

(56) References Cited

U.S. PATENT DOCUMENTS

| | | | |
|---|---|---|---|
| 6,262,926 B1 | 7/2001 | Nakai | |
| 6,434,044 B1* | 8/2002 | Gongwer et al. | 365/185.18 |
| 6,956,769 B2 | 10/2005 | Lee | |
| 7,308,524 B2* | 12/2007 | Grundy et al. | 711/103 |
| 2006/0097284 A1* | 5/2006 | Ronen | 257/203 |

* cited by examiner

*Primary Examiner*—Phuc T Dang
(74) *Attorney, Agent, or Firm*—Vierra Magen Marcus & DeNiro LLP

(57) ABSTRACT

The present invention teaches the recycling of a faulty multi-die memory package by isolating the functional part of the package and using it as a smaller memory package.

3 Claims, 3 Drawing Sheets

RECYCLING FAULTY MULTI-DIE PACKAGES

This patent application claims the benefit of U.S. Provisional Patent Application No. 60/757,602 filed Jan. 11, 2006.

FIELD AND BACKGROUND OF THE INVENTION

The present invention relates to a system and method for recycling multi-die packages containing faulty dies. The recycling of faulty multi-die memory package is accomplished by isolating the functional part of the package and using it as a smaller memory package.

Multi-die packages are well-known in the art of digital memory manufacturing. They are typically used when it is not practical to provide the required volume of memory with a single chip, due to die-manufacturing limitations.

As the dies used in multi-die packages are themselves large, their yield is finite and limited. Sometimes faulty dies are discovered in the "die sort" process, in which the dies are tested in the uncut wafer. However, some faulty dies are not detected until after the wafer is cut and the dies are assembled. At this stage, there is no way to make use of a functional die if one of the neighboring dies in the package is faulty. This causes a significant reduction in yield, and a significant loss of profit to the manufacturer.

By way of numerical example, if the probability of a die being discovered as faulty after assembly is 10%, then the probability of a faulty dual-die package is 19%, and the probability of a package with one functional die is 18%, resulting from the expression: $1-(0.9*0.9+0.1*0.1)$.

These percentages would result in affecting significant production quantities. A faulty multi-die package cannot be practically used as a single-die package, since it is not usually marked as faulty. In other words, the functional die is not singled out, and, in many cases, the presence of the faulty die disturbs the use of the functional die. It would be desirable to provide a method and means for using such faulty multi-die packages as single-die packages.

The problem described above is significant in situations where stacking of large dies is common. Typically, these cases arise mainly production of high-density flash memory devices (which are currently mostly NAND-type memory), and production of large DRAM devices. Stacking memory dies is a popular practice since this procedure provides greater density of dies for the same package area.

The cost of manufacturing large dies is high. In addition, large dies suffer from relatively high failure rates. While in other types of integrated digital circuits there is no way to make use of a portion of a component, memory chips are functionally homogeneous. Therefore, a portion of a memory device can, in principle, be useful as a smaller-capacity memory chip. There is no prior art describing a way to use memory chips that are partially damaged in production.

It would be desirable to have a method for recycling (i.e. converting) a faulty multi-die package into a package with a smaller number of active dies that can be practically used.

SUMMARY OF THE INVENTION

For the purpose of clarity, several terms which follow are specifically defined for use within the context of this application. The term "multi-die" is used in this application to refer to a package containing more than one memory die of similar type (also known as a multi-die package). The term "SDP" is used in this application to refer to a single-die package. The term "DDP" is used in this application to refer to a multi-die containing two similar dies (i.e. dual-die package). The term "QDP" is used in this application to refer to multi-die containing four similar dies (i.e. quad-die package).

The term "top die" is used in this application to refer to the die that is selected as the upper die in a DDP. The term "bottom die" is used in this application to refer to the die that is selected as the lower die in a DDP. The term "functional die" is used in this application to refer to a die that is not faulty.

Furthermore, the term "die-pad" is used in this application to refer to a conductive area in the periphery of a die used for connecting the die to the external system, typically via a bond and a pin. The term "body of the package" is used in this application to refer to the solid part of the package, excluding the connection pins. The term "self-isolating design" is used in this application to refer to an I/O circuit that is designed not to load other interconnected devices when its voltage supply, or VCC, is disconnected. The term "active" is used in this application to refer to a die which has power supplied to it. Similarly, a die that is not active refers to a die which has no power supplied to it.

It is the purpose of the present invention to provide methods and means for designing a multi-die package such that upon detection of a faulty die, it will be easily retrofitted to become a usable package having a smaller quantity of active dies.

For the purpose of clarity, an overview of the methods and means for making a faulty DDP into a usable SDP, according to the present invention, will be described here. These methods can include: (1) separating certain pins in the package so that, when needed, the faulty die can be isolated externally; (2) embedding a fuse connection in the die that, when required, can be burned out by a surge of current; and (3) other similar approaches well-known in the art of electrical engineering.

When two similar dies are used as the top die and bottom die in a DDP, each of them has to have its status as top or bottom specified so that the host system can address each of them separately. In the prior art, this is done in several alternative ways. In order to better understand the present invention, several alternative approaches that are feasible to implement are described herein. Representative embodiments of these approaches include:

(1) A permanent (i.e. "hard-wired") distinction between the dies, distinguishing between dies that are manufactured to serve as top dies from dies that are manufactured to serve as bottom dies, can built into the dies;

(2) Based on the fact that the die has a non-volatile memory, a data bit that indicates if the die is assigned to be a top die or a bottom die can be programmed into the die during manufacturing. Implementation of this method allows the dies to be physically identical in their manufacturing, and to be labeled as "top" or "bottom" by software. Since the amount of data to be stored using this approach is just one bit of information, a simple fuse can serve as this data-bit memory. Implementation of this method allows such a fuse to be burned to designate one type of die, and left unburned to designate another type of die;

(3) A Unique serial number can be programmed into each of the dies which can be read and decoded by the host computer, as is done with ISA Plug & Play devices. Implementation of this method allows the serial number to be interpreted as an index for the appropriate address location;

(4) A binary control input can be provided to each die designating each die with a top or bottom status. Implementation of this method allows the designation of the die to be determined upon installation in the host system; and (5) A separate "chip select" signal for each die (or cluster of dies that uses one of the methods above) can be provided to instruct one of the dies. to become operational upon signaling the package. Implementation of this method allows the role of the die to be flexible, and allows both dies to be identical in their manufacturing and installation.

Embodiments of the present invention cause the package to connect the host system to the functional die in accordance with the corresponding method of die designation chosen. Using the list of five approaches of die designation described above as examples, connection of the host system to the functional die occurs in the following ways:

(a) If die designation is hard-wired into the die (as in (1) described in the previous section), then available dies for recycling will inherently be of two types: "functional top dies" and "functional bottom dies". The host system using the recycled DDP can then be of two types, each type having:
  (i) a pair of locations on the host system: one wired for a functional top die, and one wired for a functional bottom die. Only one of the locations contains the recycled die, corresponding to the type of die, either functional top or functional bottom (The host system can then verify, upon being powered, which of the two dies is present, and address the die appropriately, according to its designated status. The other empty socket will not disturb the process.); or
  (ii) two versions of a host system that are identical in function, but differ in the type of recycled die they accommodate (One version wired for a functional top die, ignoring the bottom die, and the other version wired for a functional bottom die, ignoring the top die). The first version of the host system is used with a recycled die having a functional top die, and the second version is used with a recycled die having a functional bottom die;

(b) If die designation is programmed into the die during the manufacturing of the die (as in (2) and (3) described in the previous section), then a solution as in (a), described above, can be applied;

(c) If die designation is controlled by external wiring of the die (as in (4) described in the previous section), then the host system can have one socket, and can be programmed to treat the recycled die always as a top die, sending both dies instructions to behave like top dies, and neutralizing the faulty die by not providing it with power (i.e. VCC). Clearly, the host system can be designed to use any recycled die of this type as a bottom die as well. The selective VCC application can be implemented, either constructively or destructively, as follows:
  (i) Constructively - the VCC of the faulty die can be left unconnected, and the VCC of the functional die can be connected; or
  (ii) Destructively - both VCC lines can be connected in advance, and the VCC of the faulty die can be cut, broken, or insulated; and (d) If die designation is made using a "chip select" signal (as in (5) described in the previous section), then a solution as in (c), described above, for external wiring designation can be applied. The host system can always instruct both dies to be "top dies" and provide VCC only to the functional die.

The above descriptions explain four possible methods of enabling the present invention. The four methods are in no way meant to be an exhaustive list. They were selected merely to show "two-by-two" combinations, meaning: hardware approaches (methods (a) and (c)), software approaches (methods (b) and (d)), built-in approaches (methods (a) and (b)), and externally-controlled approaches (methods (c) and (d)).

In all of the embodiments described above, where one of two pads needs to be connected to a single source, means are provided to disconnect one of the two pre-wired connections, or connect one of two disconnected connections. Typical means for disconnecting pre-wired connections are: mechanical cutting, burning by excessive current flow, and insulating with a non-conductive coating. All of these methods, in addition to others, are well-known in the art. Typical means for connecting two disconnected pads are conductive connections (e.g. soldered wires). These approaches are also well-known in the art.

Therefore, according to the present invention, there is provided for the first time a multi-die memory package, the package including: (a) a plurality of memory dies; and (b) at least one external connection from the package for each of the plurality of memory dies, at least one of the external connections for providing a voltage supply line exclusively to a single die of the plurality of memory dies.

Preferably, the plurality of memory dies includes flash memory dies.

Preferably, the plurality of memory dies includes NAND-type flash memory dies.

Preferably, the plurality of memory dies has one external connection that is configured in a self-isolating design.

Preferably, one external connection is configured to provide a voltage supply line exclusively for I/O circuitry to a single die of the plurality of memory dies.

According to the present invention, there is provided for the first time a multi-die memory package, the package including: (a) a plurality of memory dies, a first memory die of the plurality of memory dies is not active at a time when a second memory die of the plurality of memory dies is active.

Preferably, the plurality of memory dies includes flash memory dies.

Preferably, the plurality of memory dies includes NAND-type flash memory dies.

Preferably, the first memory die is faulty.

According to the present invention, there is provided for the first time a memory product line, the product line including: (a) at least two memory products having: (i) a substantially-equal usable memory size; (ii) a different interface specification for each of the memory products; and (iii) at least two memory dies, wherein each of the memory products has a different subset of memory dies that are not active.

Preferably, the memory dies include flash memory dies.

Preferably, the memory dies include NAND-type flash memory dies.

According to the present invention, there is provided for the first time a method of using a multi-die memory package, the method including the steps of: (a) manufacturing the multi-die memory package to contain a plurality of memory dies; (b) detecting failure in a first memory die of the plurality of memory dies; and (c) activating a second memory die of the plurality of memory dies, while the first memory die is not active.

Preferably, the step of manufacturing the multi-die memory package to contain a plurality of memory dies includes manufacturing a plurality of flash memory dies.

Preferably, the step of manufacturing the multi-die memory package to contain a plurality of memory dies includes manufacturing a plurality of NAND-type flash memory dies.

These and further embodiments will be apparent from the detailed description and examples that follow.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a system and method for recycling multi-die packages containing faulty dies. The principles and operation for recycling multi-die packages containing faulty dies, according to the present invention, may be better understood with reference to the drawings and the accompanying description.

Figure 1:
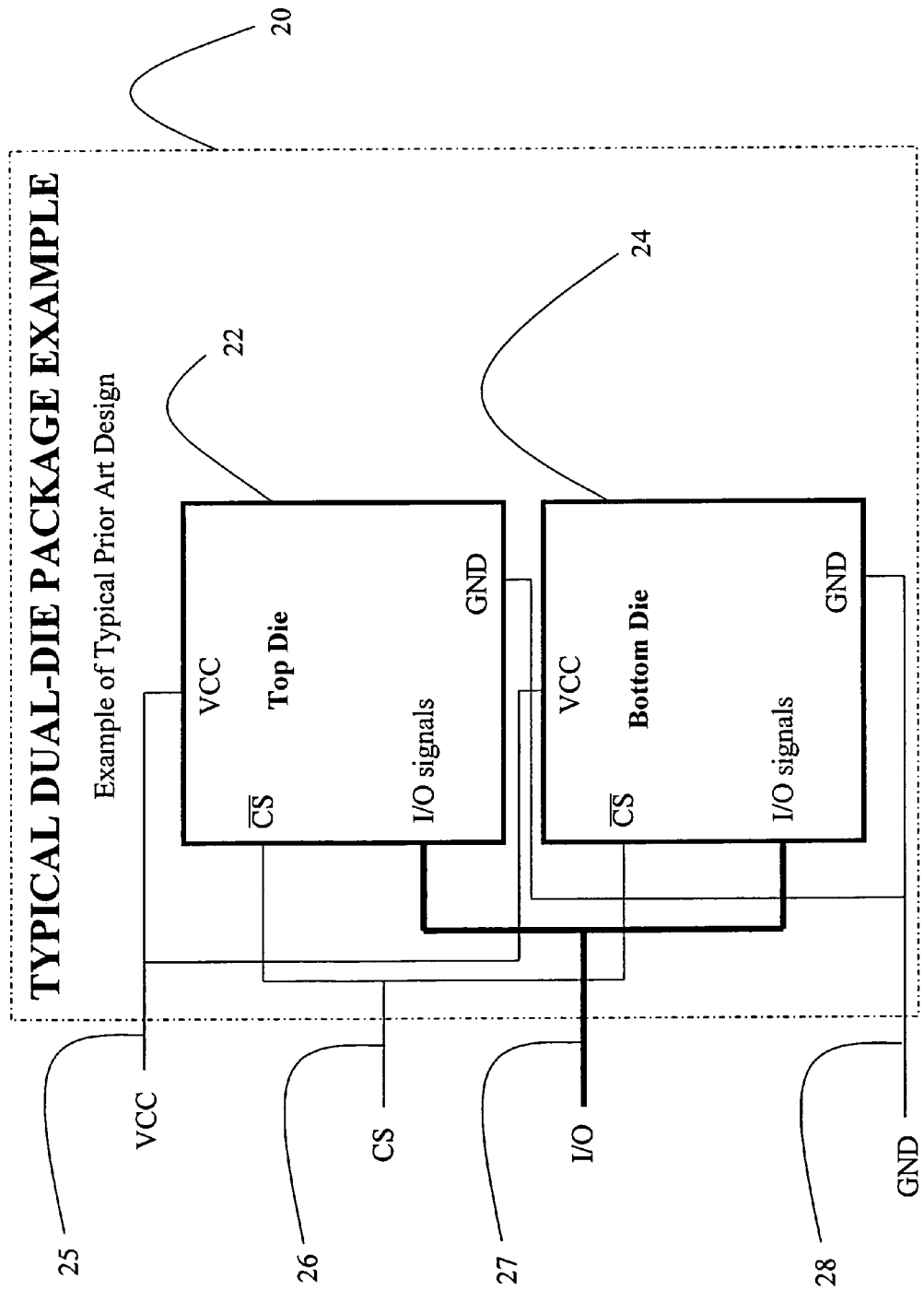
FIG. 1 shows a simplified schematic diagram of a DDP example with a typical prior art design.

FIG. 1 shows a simplified schematic diagram of a typical dual-die package example 20 (or DDP example 20) containing a top die 22 and a bottom die 24. DDP example 20, shown in FIG. 1, serves the purpose of showing how a prior art DDP is typically designed. It is clear from this architecture that if top die 22 is faulty, the performance of bottom die 24, and thereby all of DDP example 20 may be impacted, since top die 22 remains connected to all package contacts (namely, VCC 25, CS 26, I/O 27, and GND 28). VCC 25 is the DC voltage supply, CS 26 is the "chip select" (used to individually select the package of chips on the bus while deselecting other packages), I/O 27 is the input/output signals, and GND 28 is the ground of DDP example 20. We describe FIG. 1 as an example not only of a prior art design, but also as an example of multi-die packages. While the design shown in FIG. 1 is for a DDP, a similar design can be used for multi-die packages as well.

Figure 2:
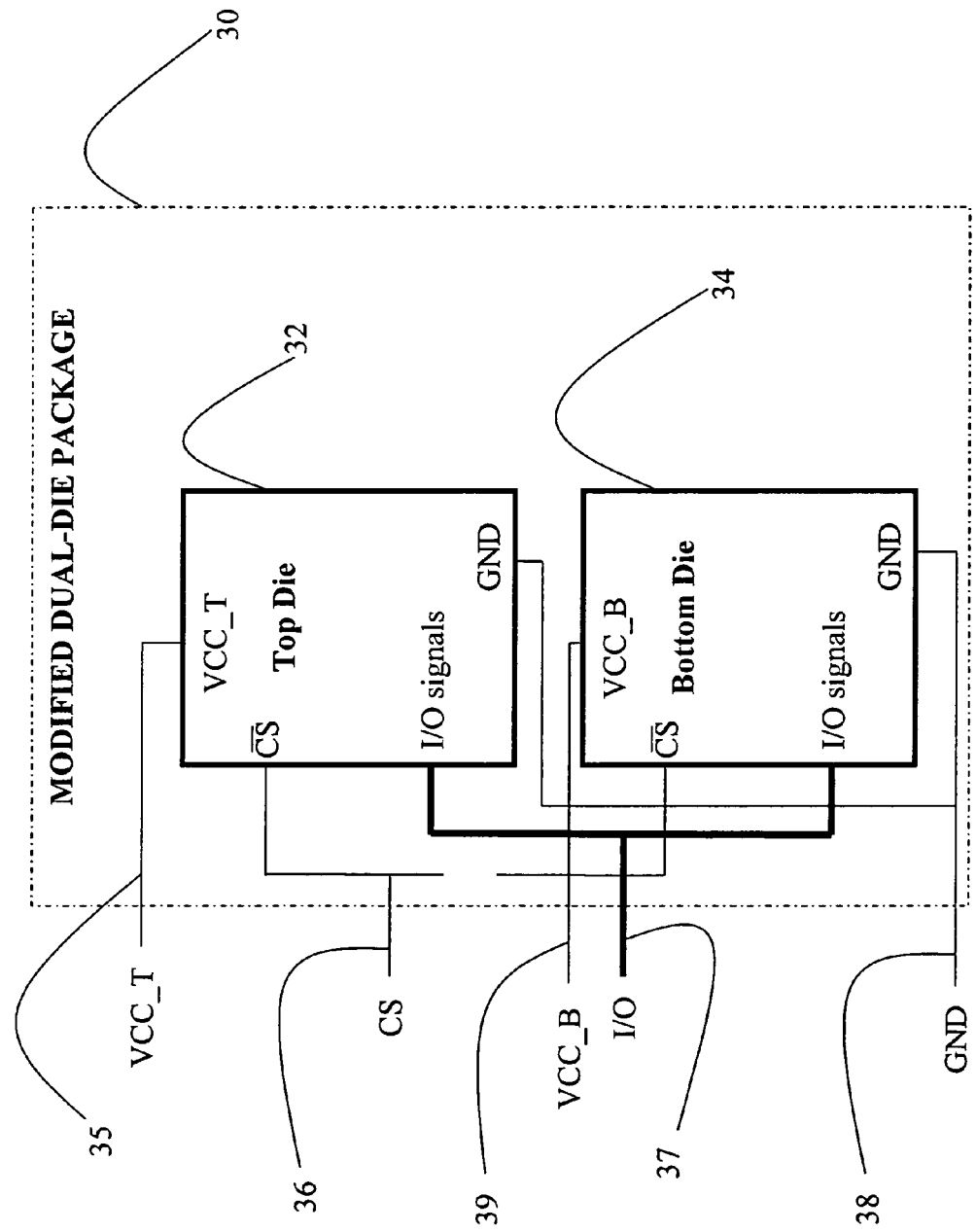
FIG. 2 shows a simplified schematic diagram of a DDP package with modified VCC lines.

FIG. 2 shows a simplified schematic diagram of a modified dual-die package 30 (or DDP 30) containing a top die 32 and a bottom die 34. DDP 30 includes a separate DC power supply for each of the two dies, and has a separate pin on the package of DDP 30. A VCC_T 35 supplies DC voltage to top die 32, and a VCC_B 39 supplies DC voltage to bottom die 34. This embodiment is in contrast to the architecture of DDP example 20 shown in FIG. 1, which has only a common VCC 25 to supply power to both top die 22 and bottom die 24. DDP 30 (shown in FIG. 2) utilizes a common CS 36, I/O 37, and GND 38 similar to DDP example 20 (shown in FIG. 1). While the design shown in FIG. 2 is for a DDP, a similar design can be used for multi-die packages as well.

In a case where one of the two dies is faulty and has to be isolated, DDP 30, shown in FIG. 2, allows the relevant VCC pin (either VCC_T 35 or VCC_B 39) to be disconnected by a user. In this scenario, the faulty multi-die packages can be sorted into categories of "top faulty" and "bottom faulty". The user of these packages, which have become SDPs due to one die being faulty, can design the systems that they will be implemented in such that no voltage is supplied to the pins of the faulty dies. For example, one could neutralize (i.e. disable) all the bottom dies in a case where the bottom dies happen to be the faulty dies.

Additional ways to neutralize one of the dies may include: (1) cutting the leg (i.e. pin) of the package that corresponds to the faulty die; (2) coating the leg of the package that corresponds to the faulty die with an insulating coating, well-known in the art of electrical engineering; (3) eliminating the conductive pad (i.e. solder joint) underneath the relevant conductor of the package that corresponds to the faulty die; and (4) melting an in-line fuse connection into the relevant VCC circuit trace, thus disconnecting the voltage supply.

It can be appreciated that there are other methods and means for disconnecting a die-pad from the power supply system. The present invention is meant to include embodiments of any such method or means.

It should be noted that, in the present invention, the die has to be designed such that when it does not obtain the voltage at the pin of the faulty die, the die will neither load the host system nor cause interference to the second die. Such methods of die design are well-known in the art and are often used in line receivers (such as the AM26C32—Quadruple Differential Line Receiver, available from Texas Instruments, Post Office Box 655303 Dallas, Tex. 75265, described in the pdf web focus file: http://focus.ti.com/lit/ds/symlink/am26c32.pdf), where the receiver is often turned off by simply disconnecting it from the VCC. In the present application, this type of design will be called a "self-isolating design".

Figure 3:
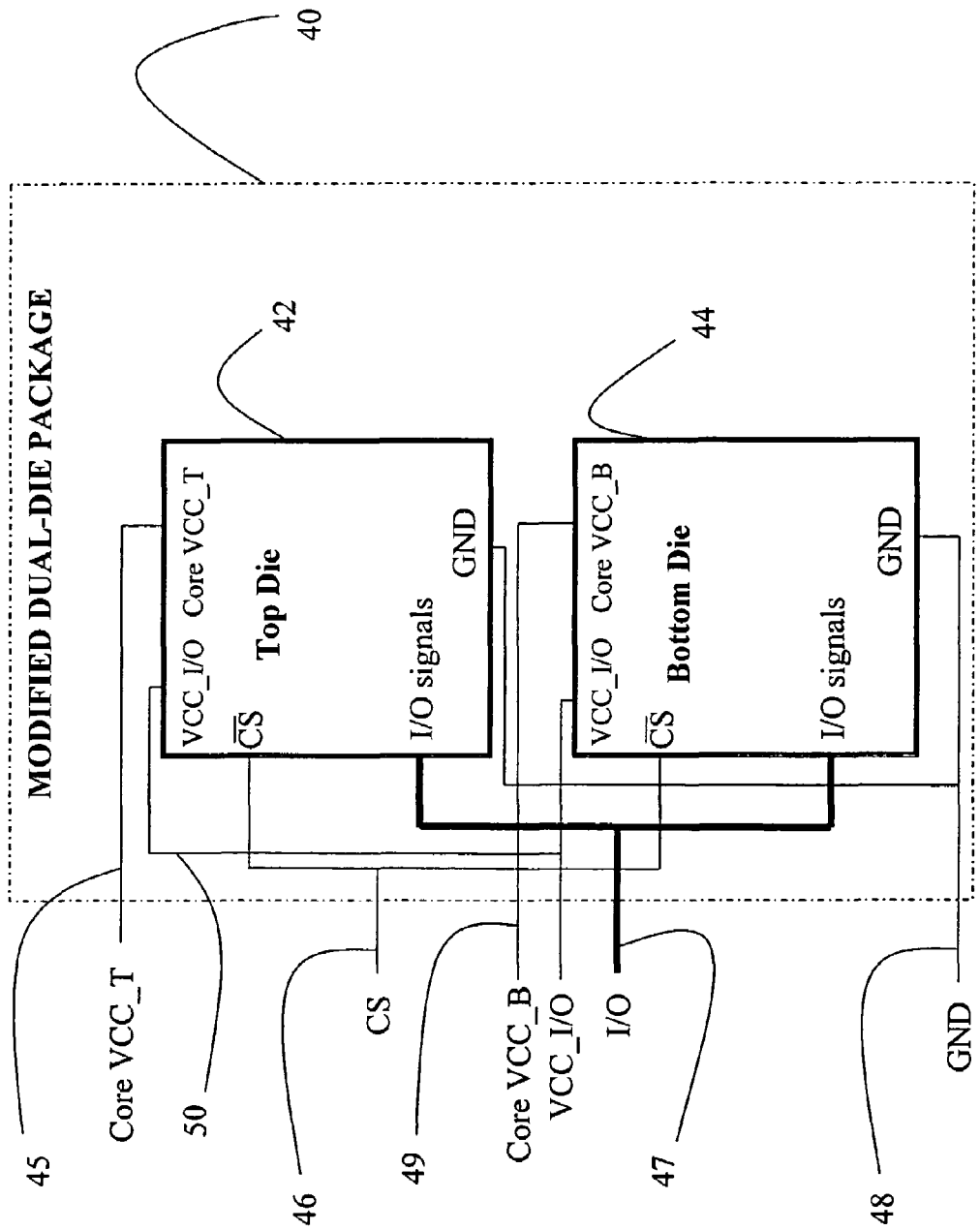
FIG. 3 shows a simplified schematic diagram of a DDP package with modified VCC lines and a VCC_I/O line.

FIG. 3 shows a simplified schematic diagram of a modified DDP 40 containing a top die 42 and a bottom die 44. In this embodiment, each die is shown to have two different voltage supplies, one for core voltage supply and one for I/O circuitry supply, connected to the package as: (1) a Core VCC_T 45 for top die 42 and a Core VCC_B 49 for bottom die 44, and (2) a common VCC_I/O 50 for I/O voltage supply to both top die 42 and bottom die 44. DDP 40 (shown in FIG. 3) utilizes a common CS 46, I/O 47, and GND 48 similar to DDP example 30 (shown in FIG. 2).

VCC_I/O 50, shown in FIG. 3, can remain common to both dies, as it feeds only I/O 47 of the dies. I/O 47 is very small, and therefore, unlikely to be the faulty part of the die. This embodiment allows a standard design for I/O 47, in contrast to I/O 37, in the embodiment of FIG. 2, which requires a specially-designed I/O in order to ensure that the faulty die will not load the host system. However, in a another preferred embodiment of the present invention, VCC_I/O 50 of the two dies can be separated into individual supplies for each die so that one of the dies can be neutralized by disabling its corresponding I/O VCC (not shown). Thus, according to the present invention, a faulty die can be neutralized by disabling its VCC, disabling its I/O VCC, or disabling both elements. While the design shown in FIG. 3 is for a DDP, a similar design can be used for multi-die packages as well.

It should be noted that the present invention includes any embodiment in which a multi-die package is designed to enable neutralization (i.e. disablement) of faulty dies in order to salvage the functional dies. With regard to the multi-die package, embodiments containing any number of dies in a package of two or more are included in the present invention. Furthermore, it should also be noted that the present invention includes embodiments with any number of VCC supply lines, as long as at least some of these supply lines are separated in order to isolate faulty dies.

While the invention has been described with respect to a limited number of embodiments, it will be appreciated that many variations, modifications, and other applications of the invention may be made.

What is claimed is:

1. A memory product line, the product line comprising:
   (a) at least two memory products, said at least two memory products having:
      (i) a substantially-equal usable memory size;
      (ii) a different interface specification for each said at least two memory products; and (iii) at least two memory dies, wherein each of said at least two memory products has a different subset of said at least two memory dies that is not active.

2. The package of claim 1, wherein said at least two memory dies includes flash memory dies.

3. The package of claim 1, wherein said at least two memory dies includes NAND-type flash memory dies.

* * * * *